United States Patent
Lee

(10) Patent No.: US 7,177,206 B2
(45) Date of Patent: Feb. 13, 2007

(54) POWER SUPPLY CIRCUIT FOR DELAY LOCKED LOOP AND ITS METHOD

(75) Inventor: Kang-Seol Lee, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/882,454

(22) Filed: Jun. 30, 2004

(65) Prior Publication Data

US 2005/0105378 A1    May 19, 2005

(30) Foreign Application Priority Data

Oct. 29, 2003    (KR)    ........................ 10-2003-0075931

(51) Int. Cl.
*G11C 7/00*    (2006.01)
*G11C 5/14*    (2006.01)

(52) U.S. Cl. ...................... 365/194; 365/226; 365/233; 327/158

(58) Field of Classification Search ................ 365/233, 365/226, 227, 194; 327/158, 538
See application file for complete search history.

(56) References Cited

U.S. PATENT DOCUMENTS

| | | | | |
|---|---|---|---|---|
| 5,903,513 A | * | 5/1999 | Itou | ........................... 365/233 |
| 6,101,137 A | * | 8/2000 | Roh | ............................ 365/194 |
| 6,229,364 B1 | * | 5/2001 | Dortu et al. | ................ 327/158 |
| 6,316,987 B1 | * | 11/2001 | Dally et al. | ................. 327/538 |
| 6,438,060 B1 | * | 8/2002 | Li et al. | ..................... 365/227 |
| 6,489,822 B2 | * | 12/2002 | Han | ........................... 327/158 |
| 6,650,594 B1 | | 11/2003 | Lee et al. | |
| 6,677,791 B2 | * | 1/2004 | Okuda et al. | ............... 327/158 |
| 6,724,228 B2 | * | 4/2004 | Kashiwazaki | ............... 327/158 |
| 6,741,507 B2 | * | 5/2004 | Iwamoto | ..................... 365/194 |
| 6,870,790 B2 | * | 3/2005 | Horiguchi et al. | .......... 365/233 |
| 2002/0064083 A1 | | 5/2002 | Ryu et al. | |
| 2003/0210578 A1 | | 11/2003 | Park | |
| 2003/0235106 A1 | | 12/2003 | Thomann et al. | |
| 2004/0042282 A1 | | 3/2004 | Li et al. | |

FOREIGN PATENT DOCUMENTS

| | | |
|---|---|---|
| JP | 08-147967 | 6/1996 |
| JP | 11-185470 | 7/1999 |
| KR | 1999-0075064 | 10/1999 |

* cited by examiner

*Primary Examiner*—Trong Phan
(74) *Attorney, Agent, or Firm*—Blakely Sokoloff Taylor & Zafman

(57) ABSTRACT

A delay locked loop (DLL) power supply circuit for use in a semiconductor memory device, including: a DLL power supplier for supplying a DLL power supply voltage to a DLL in response to a reference voltage and a clock enable exit pulse signal; and a pulse signal generator for generating the clock enable exit pulse signal in response to a clock enable signal.

14 Claims, 8 Drawing Sheets

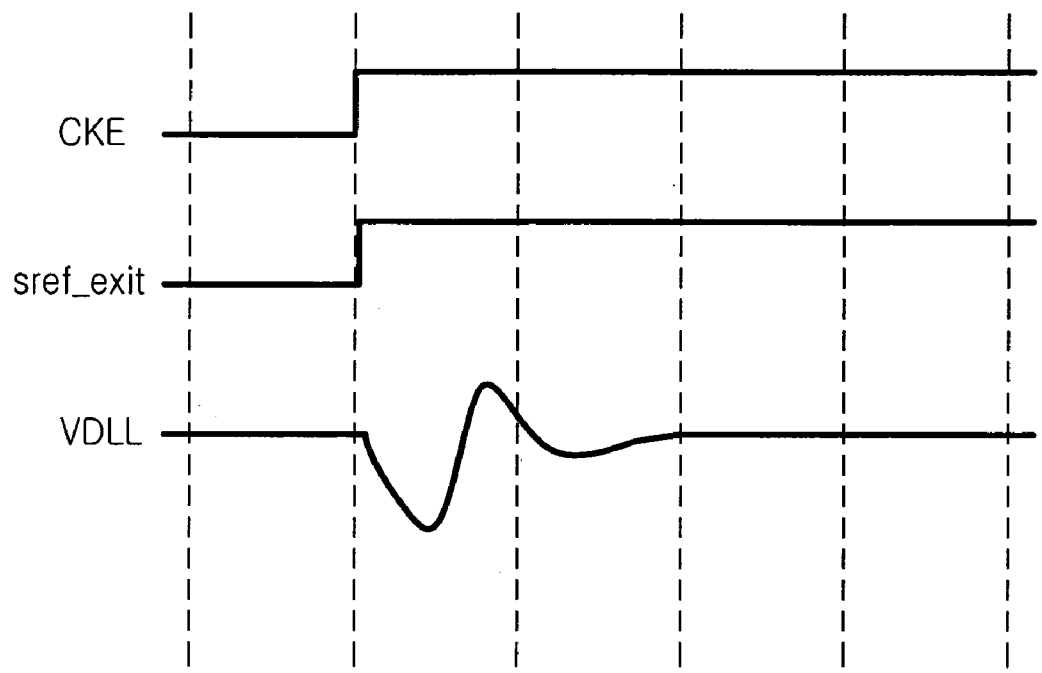

POWER SUPPLY CIRCUIT FOR DELAY LOCKED LOOP AND ITS METHOD

FIELD OF INVENTION

The present invention relates to a semiconductor device; and, more particularly, to a power supply circuit for supplying a stable power to a delay locked loop (DLL).

DESCRIPTION OF PRIOR ART

Generally, a delay locked loop (DLL) is used for a synchronous semiconductor memory device so that the synchronous semiconductor memory device can be operated in synchronization with an external clock signal. Since a time delay is generated while the external clock signal is inputted to the synchronous semiconductor memory device, the DLL is employed for synchronizing an internal clock signal with the external clock signal.

The synchronous semiconductor memory device also includes a power supply circuit for supplying power to the DLL. The power supply circuit should supply a stable power to the DLL so that the DLL can be stably operated.

FIG. 1A is a block diagram showing a delay locked loop (DLL) 120 and a DLL power supplier 110 included in a conventional semiconductor memory device.

As shown, the DLL power supplier 110 supplies a DLL power supply voltage VDLL to the DLL 120 so that the DLL 120 can be operated.

The DLL power supplier 110 enabled by a first enable signal EN1 receives a reference voltage VREFD in order to control a voltage level of the DLL power supply voltage VDLL. That is, if the voltage level of the DLL power supply voltage VDLL becomes lower than the reference voltage VREFD, the DLL power supplier 110 raises the voltage level of the DLL power supply voltage VDLL. On the other hand, if the voltage level of the DLL power supply voltage VDLL becomes higher than the reference voltage VREFD, the DLL power supplier 110 lowers the voltage level of the DLL power supply voltage VDLL.

FIG. 1B is a schematic circuit diagram showing the DLL power supplier 110.

As shown, the DLL power supplier 110 includes a first p-channel metal oxide semiconductor (PMOS) transistor MP1, a second PMOS transistor MP2, a third PMOS transistor MP3, a first n-channel metal oxide semiconductor (NMOS) transistor MN1, a second NMOS transistor MN2 and a third NMOS transistor MN3 having a gate coupled to the first enable signal EN1.

Each source of the first to the third PMOS transistors MP1 to MP3 is connected to a power supply voltage VDD. The first NMOS transistor MN1 is connected between the first PMOS transistor MP1 and the third NMOS transistor MN3. The second NMOS transistor MN2 is connected between the second PMOS transistor MP2 and the third NMOS transistor MN3. A source of the third NMOS transistor MN3 is connected to a ground voltage VSS.

A gate of the second NMOS transistor MN2 and a drain of the third PMOS transistor MP3 are connected each other and output the DLL power supply voltage VDLL. A gate of the first NMOS transistor MN1 is connected to the reference voltage VREFD.

An operation of the DLL power supplier 110 is described below referring to FIGS. 1A and 1B.

If the DLL power supply voltage VDLL becomes lower than the reference voltage VREFD, current flown on the second NMOS transistor MN2 becomes less than that of the first NMOS transistor MN1. That is, if current flown on the first NMOS transistor MN1 is increased, current flown on a gate of the third PMOS transistor MP3 is decreased because current flown on the first PMOS transistor MP1 is fixed. As a result, current flown from the third PMOS transistor MP3 to the DLL 120 is increased, i.e., the voltage level of the DLL power supply voltage VDLL is increased.

On the other hand, if the DLL power supply voltage VDLL becomes higher than the reference voltage VREFD, more current is flown on the second NMOS transistor MN2 that the first NMOS transistor MN1. That is, if current flown on the first NMOS transistor MN1 is decreased, current flown on a gate of the third PMOS transistor MP3 is increased because current flown on the first PMOS transistor MP1 is fixed. As a result, current flown from the third PMOS transistor MP3 to the DLL 120 is decreased, i.e., the voltage level of the DLL power supply voltage VDLL is lowered.

Meanwhile, since a data access operation such as a read operation or a write operation is performed in synchronization with a delay locked clock signal generated by the DLL 120, the DLL power supplier 110 should supply a stale power to the DLL 120 so that the DLL 120 can be stably operated.

However, if the DLL 120 is operated when the conventional semiconductor memory device is exit from a power down mode or a self refresh mode, there occurs an instantaneous noise of the DLL power supply voltage VDLL.

FIG. 1C is a timing diagram showing an abnormal fluctuation of the DLL power supply voltage VDLL due to the instantaneous noise of the DLL power supply voltage VDLL.

As shown, if a clock enable signal CKE and a self refresh exit signal sref_exit are activated as a logic high level when the conventional semiconductor memory device is exit from the power down mode or the self refresh mode, the DLL power supply voltage VDLL is fluctuated abnormally during short period of time due to the instantaneous noise of the DLL power supply voltage VDLL described above.

If the conventional semiconductor memory device is exit from the power down mode, the DLL 120 is required to be locked within two clocks because the data access operation can be performed after two clocks. However, if the DLL power supply voltage VDLL is fluctuated abnormally, the DLL 120 may not be locked within two clocks.

During the self refresh mode, the DLL power supplier 110 is disabled to save a power. If the conventional semiconductor memory device is exit from the self refresh mode, the DLL power supplier 110 is enabled again. However, the DLL power supplier 110 requires a predetermined set up time for stably generating the DLL power supply voltage VDLL. During the predetermined set up time the DLL power supply voltage VDLL is unstable. Therefore, since the DLL 120 is enabled at the same timing when the DLL power supplier 110 is enabled when the conventional semiconductor memory device is exit from the self refresh mode, DLL 120 may be operated abnormally due to the unstable DLL power supply voltage VDLL. As a result, the conventional semiconductor memory device may be operated unstably when it is exit from the power down mode or the self refresh mode.

SUMMARY OF INVENTION

It is, therefore, an object of the present invention to provide a circuit and a method in order to minimize a noise of a DLL power supply voltage for stabilizing the DLL power supply voltage.

In accordance with an aspect of the present invention, there is provided a delay locked loop (DLL) power supply circuit for use in a semiconductor memory device, including: a DLL power supplier for supplying a DLL power supply voltage to a DLL in response to a reference voltage and a clock enable exit pulse signal; and a pulse signal generator for generating the clock enable exit pulse signal in response to a clock enable signal.

In accordance with another aspect of the present invention, there is provided a method for controlling a DLL power supply voltage which is supplied to a DLL, including the steps of: comparing a reference voltage with the DLL power supply voltage and outputting the comparison result; raising or lowering a voltage level of the reference voltage based on the comparison result; and outputting a power supply voltage as the DLL power supply voltage when a power down mode or a self refresh mode is terminated.

BRIEF DESCRIPTION OF THE DRAWINGS

The above and other objects and features of the present invention will become apparent from the following description of preferred embodiments taken in conjunction with the accompanying drawings, in which:

FIG. 1C is a timing diagram showing an operation of a DLL power supplier shown in FIG. 1A;

DETAILED DESCRIPTION OF INVENTION

Hereinafter, a semiconductor device in accordance with the present invention will be described in detail referring to the accompanying drawings.

Figure 2A:
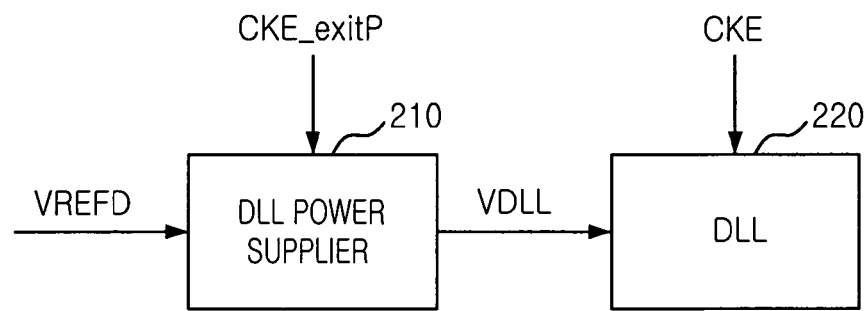
FIG. 2A is a block diagram showing a DLL and a DLL power supplier included in a semiconductor memory device in accordance with a first embodiment of the present invention.

FIG. 2A is a block diagram showing a delay locked loop (DLL) 220 and a DLL power supplier 210 included in a semiconductor memory device in accordance with a first embodiment of the present invention.

As shown, the DLL power supplier 210 enabled by a first enable signal EN1 supplies a DLL power supply voltage VDLL to the DLL 220 in response to a reference voltage VREFD and a clock enable exit pulse signal CKE_exitP so that the DLL 220 can be operated.

The DLL power supplier 210 controls a voltage level of the DLL power supply voltage VDLL in response to the reference voltage VREFD. That is, if the voltage level of the DLL power supply voltage VDLL becomes lower than a voltage level of the reference voltage VREFD, the DLL power supplier 210 raises the voltage level of the DLL power supply voltage VDLL. On the other hand, if the voltage level of the DLL power supply voltage VDLL becomes higher than the voltage level of the reference voltage VREFD, the DLL power supplier 210 lowers the voltage level of the DLL power supply voltage VDLL.

Meanwhile, particularly, when the semiconductor memory device is exit from a power down mode or a self refresh mode, the clock enable exit pulse signal CKE_exitP is activated as a logic high level so that the DLL power supplier 210 can output a power supply voltage VDD as the DLL power supply voltage VDLL.

Figure 2B:
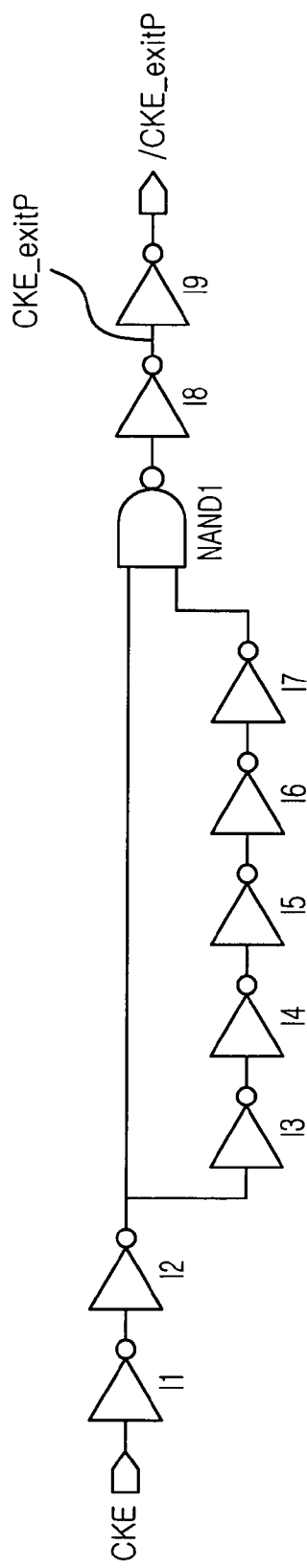
FIG. 2B is a schematic circuit diagram showing a clock enable exit pulse signal generator for generating an enable exit pulse signal.

FIG. 2B is a schematic circuit diagram showing a clock enable exit pulse signal generator for generating the clock enable exit pulse signal CKE_exitP.

As shown, the clock enable exit pulse signal generator includes a plurality of inverters I1 to I9 and a NAND gate NAND1. The clock enable signal CKE is firstly delayed while passing through the I1 and the I2 and secondly delayed while passing through the I1 to the I7.

The NAND gate NAND1 performs a NAND operation to the firstly delayed clock enable signal and the secondly delayed clock enable signal. The NAND gate NAND1 outputs a resultant to the I8. Then, the I8 outputs the clock enable exit pulse signal CKE_exitp and the I9 outputs a clock enable exit pulse bar signal /CKE_exitP.

Therefore, when the clock enable signal CKE is activated as a logic high level, the clock enable exit pulse signal CKE_exitP is activated as a logic high level and becomes into a logic low level after the predetermined time.

Figure 3A:
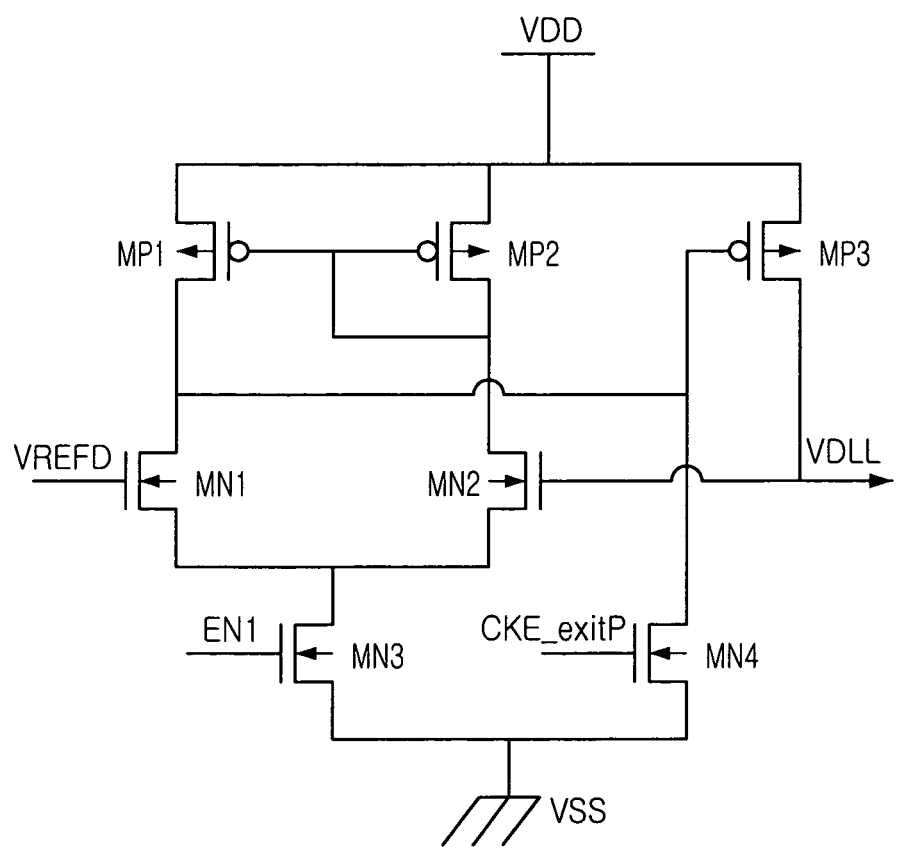
FIG. 3A is a schematic circuit diagram showing a first embodiment of a DLL power supplier shown in FIG. 2A.

FIG. 3A is a schematic circuit diagram showing a first embodiment of the DLL power supplier 210.

As shown, the DLL power supplier 210 includes a first to a third P-channel metal oxide semiconductor (PMOS) transistors MP1 to MP3 and a first to a fourth N-channel metal oxide semiconductor (NMOS) transistors MN1 to MN4.

Each of drains of the first to the third PMOS transistors MP1 to MP3 is connected to a power supply voltage VDD. Gates of the first and the second PMOS transistors are connected each other and are also connected to sources of the second PMOS transistor MP2 and the second NMOS transistor MN2.

Sources of the first PMOS transistor and the first NMOS transistor are connected each other and are also connected to a gate of the third POMOS transistor MP3 and a source of the fourth NMOS transistor MN4. A source of the third NMOS transistor MN3 having a gate coupled to the first enable signal EN1 is connected to drains of the first and the second NMOS transistors MN1 and MN2. Drains of the third and the fourth NMOS transistors MN3 and MN4 are connected to a ground voltage VSS.

Gates of the first and the fourth NMOS transistors receive the reference voltage VREFD and the clock enable exit pulse signal CKE_exitP respectively.

The clock enable exit pulse signal CKE_exitP is changed into a logic high level at the same time when the clock enable signal CKE is activated as a logic high level to enable the DLL 220. If the clock enable exit pulse signal CKE_exitP becomes in a logic high level, the fourth NMOS transistor 211 is turned on, and, thus, the ground voltage VSS is connected to the gate of the third PMOS transistor MP3. Therefore, current flown from the third PMOS transistor MP3 to the DLL 220 is increased so that the DLL power supply voltage VDLL is stably supplied to the DLL 220. Thereafter, the clock enable exit pulse signal CKE_exitP is changed into a logic low level after a predetermined time.

As a result, when the semiconductor memory device is exit from the power down mode or the self refresh mode, the DLL power supply voltage VDLL is stably supplied to the DLL 220 because the clock enable exit pulse signal CKE_exitP is activated as a logic high level for the predetermined time to turn on the third PMOS transistor MP3 and to output a stable DLL power supply voltage.

Figure 3B:
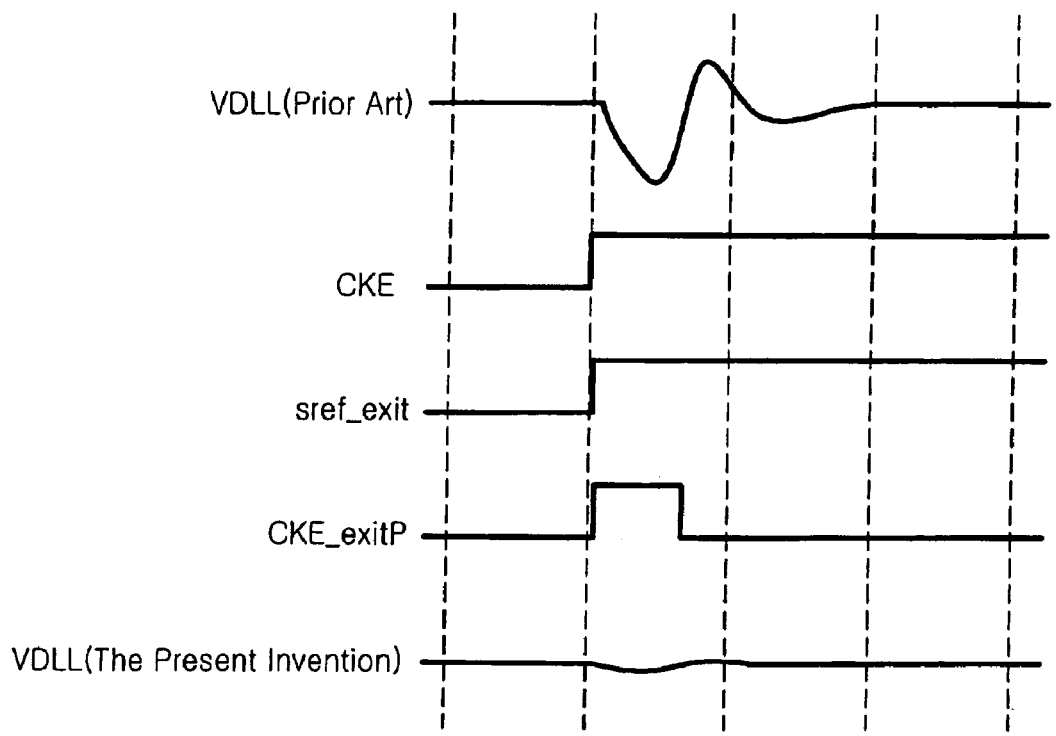
FIG. 3B is a timing diagram showing an operation of a first embodiment of a DLL power supplier shown in FIG. 3A.

FIG. 3B is a timing diagram showing an operation of the first embodiment of the DLL power supplier 210.

If the clock enable signal CKE and a self refresh exit signal sref_exit are activated as a logic high level when the semiconductor memory device is exit from the power down mode or the self refresh mode, there occurs a time delay while setting the DLL power supplier 210.

Therefore, there occurs an abnormal fluctuation of the DLL power supply voltage VDLL during the time delay in a conventional VDLL driver.

However, the first embodiment of the DLL power supplier 210 can stabilize the DLL power supply voltage VDLL during the time delay because the clock enable exit pulse signal CKE_exitP is activated as a logic high level during the time delay as described above.

Figure 4A:
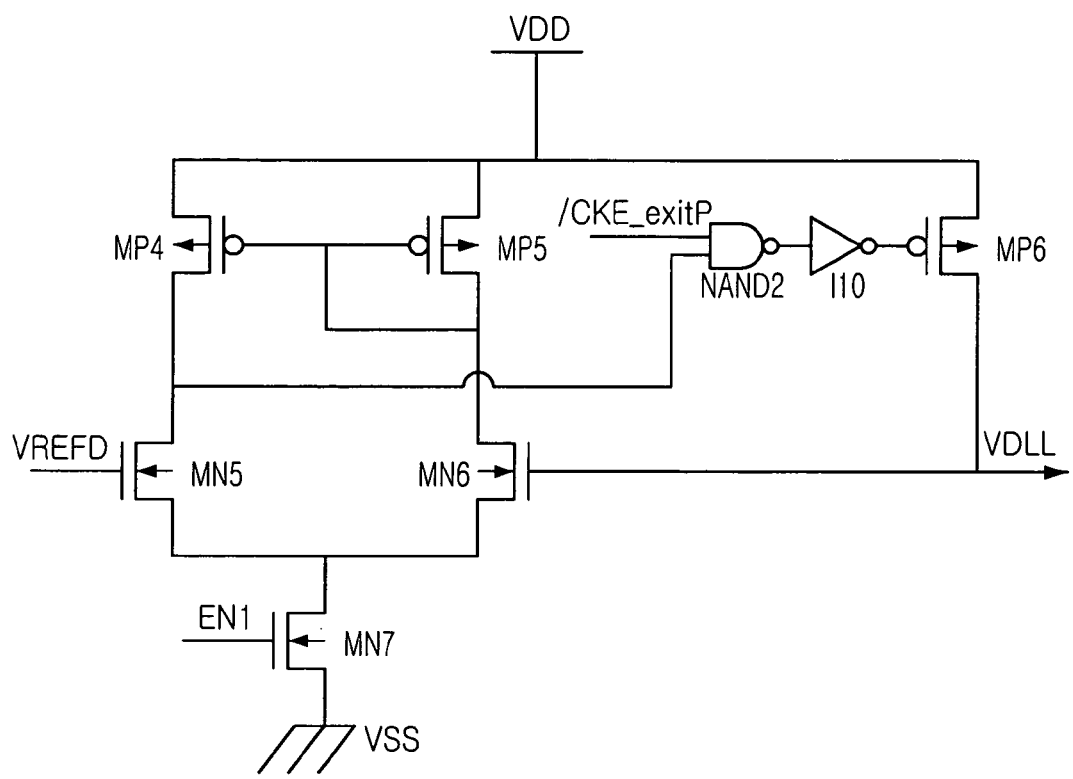
FIG. 4A is a schematic circuit diagram showing a second embodiment of a DLL power supplier shown in FIG. 2A.

FIG. 4A is a schematic circuit diagram showing a second embodiment of the DLL power supplier 210.

As shown, the DLL power supplier 210 includes a fourth to a sixth PMOS transistors MP4 to MP6, a fifth to a seventh NMOS transistors MN5 to MN7, a second NAND gate NAND2 and a tenth inverter I10.

Each of sources of the fourth to the sixth PMOS transistors MP4 to MP6 is connected to the power supply voltage VDD. Gates of the fourth and the fifth PMOS transistors MP4 and MP5 are connected each other and are also connected to drains of the fifth PMOS transistor MP5 and the sixth NMOS transistor MN6.

Drains of the fourth PMOS transistor MN4 and the fifth NMOS transistor MN5 are connected each other and are also connected to an input terminal of the second NAND gate NAND2. A drain of the seventh NMOS transistor MN7 is connected to sources of the fifth and the sixth NMOS transistors MN5 and MN6.

A gate of the fifth NMOS transistor MN5 receives the reference voltage VREFD. The second NAND gate NAND2 receives the clock enable exit pulse signal CKE_exitP and an output signal of the drains of the fourth PMOS transistor MP4 and the fifth NMOS transistor MN5.

A gate of the sixth NMOS transistor MN6 is coupled to a drain of the sixth PMOS transistor MP6 to output the DLL power supply voltage VDLL.

At the same timing when the clock enable signal CKE is activated as a logic high level, the clock enable exit pulse bar signal /CKE_exitP is activated as a logic low level. Therefore, an output signal of the tenth inverter I10 becomes in a logic low level. As a result, the sixth PMOS transistor MP6 is turned on, and the power supply voltage VDD is outputted as the DLL power supply voltage VDLL.

Figure 4B:
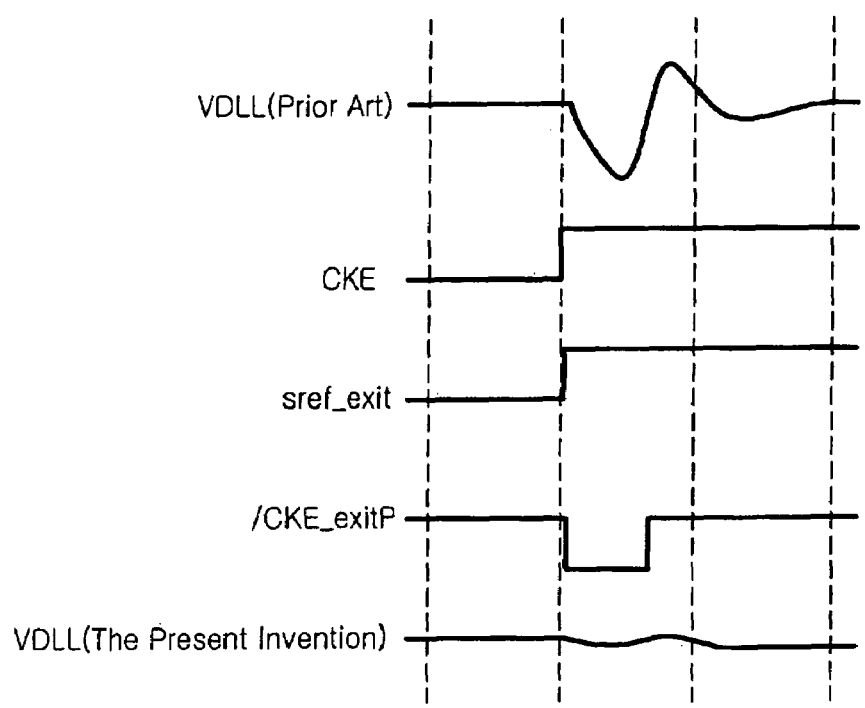
FIG. 4B is a timing diagram showing an operation of a second embodiment of a DLL power supplier shown in FIG. 4A.

FIG. 4B is a schematic circuit diagram showing an operation of the second embodiment of the DLL power supplier 210.

If the clock enable signal CKE and a self refresh exit signal sref_exit are activated as a logic high level when the semiconductor memory device is exit from the power down mode or the self refresh mode, there occurs a time delay while setting the DLL power supplier 210.

Therefore, there occurs an abnormal fluctuation of the DLL power supply voltage VDLL during the time delay in a conventional VDLL driver.

However, the first embodiment of the DLL power supplier 210 can stabilize the DLL power supply voltage VDLL during the time delay because the clock enable exit pulse signal CKE_exitP is activated as a logic high level during the time delay as described above.

Figure 5A:
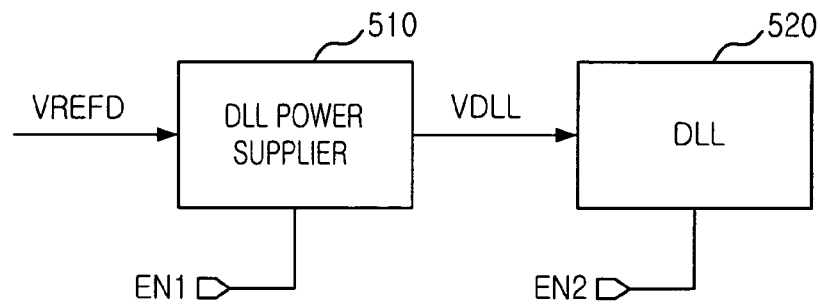
FIG. 5A is a block diagram showing a DLL power supplier included in a semiconductor memory device in accordance with a second embodiment of the present invention.

FIG. 5A is a block diagram showing a DLL power supplier 510 and a DLL 520 included in a semiconductor memory device in accordance with a second embodiment of the present invention.

The DLL power supplier 510 receives a reference voltage VREFD for controlling a voltage level of a DLL power supply voltage VDLL. That is, if the voltage level of the DLL power supply voltage VDLL becomes lower than the reference voltage VREFD, the DLL power supplier 510 raises the voltage level of the DLL power supply voltage VDLL. On the other hand, if the voltage level of the DLL power supply voltage VDLL becomes higher than the reference voltage VREFD, the DLL power supplier 510 lowers the voltage level of the DLL power supply voltage VDLL.

Figure 1A:
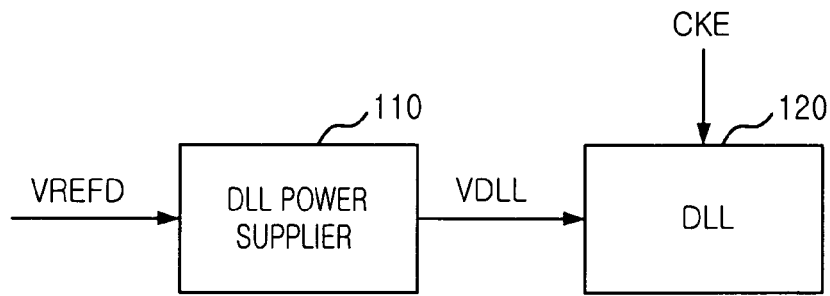
FIG. 1A is a block diagram showing a DLL and a DLL power supplier included in a conventional semiconductor memory device.
Figure 1B:
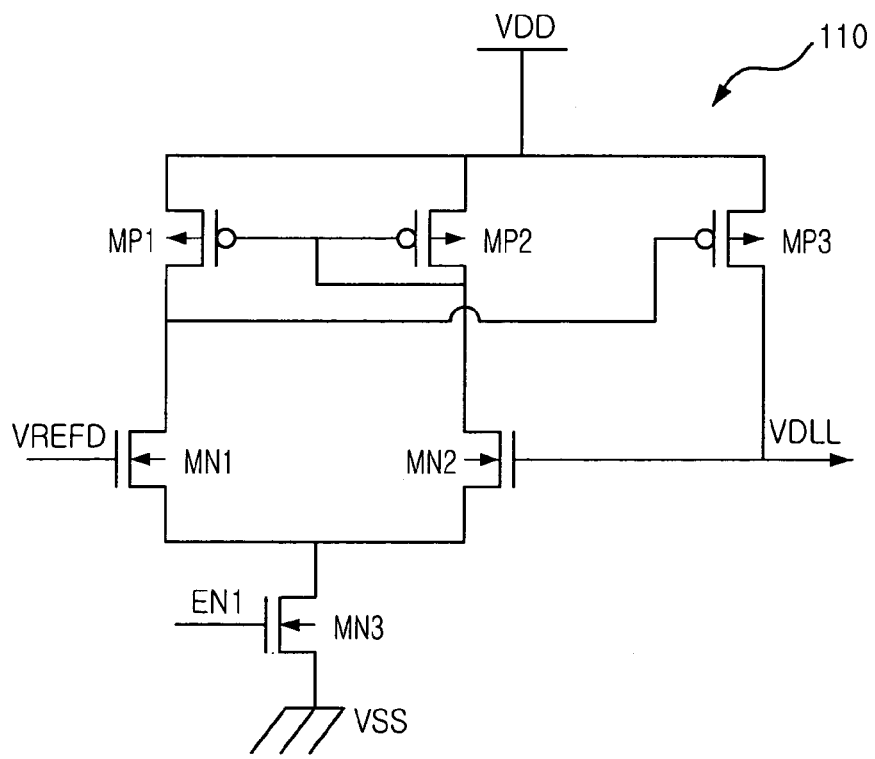
FIG. 1B is a schematic circuit diagram showing a DLL power supplier shown in FIG. 1A.

Herein, structures of the DLL power supplier 510 and the DLL 520 are the same as those of the DLL power supplier 110 and the DLL 120 shown in FIG. 1A. However, an enable signal of the DLL 520, i.e., a second enable signal EN2, is differently generated in the semiconductor memory device in accordance with the second embodiment of the present invention.

In detail, the DLL power supplier 110 and the DLL 120 are enabled in response to a clock enable signal CKE. That is, at the same timing when the clock enable signal CKE is activated as a logic high level, the DLL power supplier 110 and the DLL 120 are simultaneously enabled.

However, if the clock enable signal CKE is activated as a logic high level, the second enable signal EN2 is activated as a logic high level after a predetermined delay time.

Therefore, when the semiconductor memory device is exit from a power down mode or a self refresh mode, the DLL power supplier 510 is enabled first, and the DLL 520 is enabled after the predetermined delay time. As a result, the DLL 510 can receive a stable DLL power supply voltage when the DLL 510 is enabled.

Figure 5B:
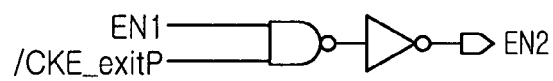
FIG. 5B is a schematic circuit diagram showing a second enable signal generator for generating a second enable signal.

FIG. 5B is a schematic circuit diagram showing a second enable signal generator for generating the second enable signal EN2.

As shown, the second enable signal generator includes a NAND gate and an inverter.

The NAND gate receives a first enable signal EN1 and a clock enable exit pulse bar signal /CKE_exitP. When the clock enable signal CKE is activated as a logic high level, the first enable signal EN1 becomes in a logic high level and the clock enable exit pulse bar signal /CKE_exitP becomes in a logic low level. At this time, an output signal of the NAND gate is in a logic high level, and, thus the second enable signal EN2 is in a logic low level. Thereafter, the clock enable exit pulse bar signal /CKE_exitP becomes in a logic high level, whereby the output signal of the NAND gate becomes in a logic low level. As a result, the second enable signal EN2 is activated as a logic high level.

Herein, the clock enable exit pulse bar signal /CKE_exitP can be generated by the clock enable exit pulse signal generator shown in FIG. 2B.

Figure 5C:
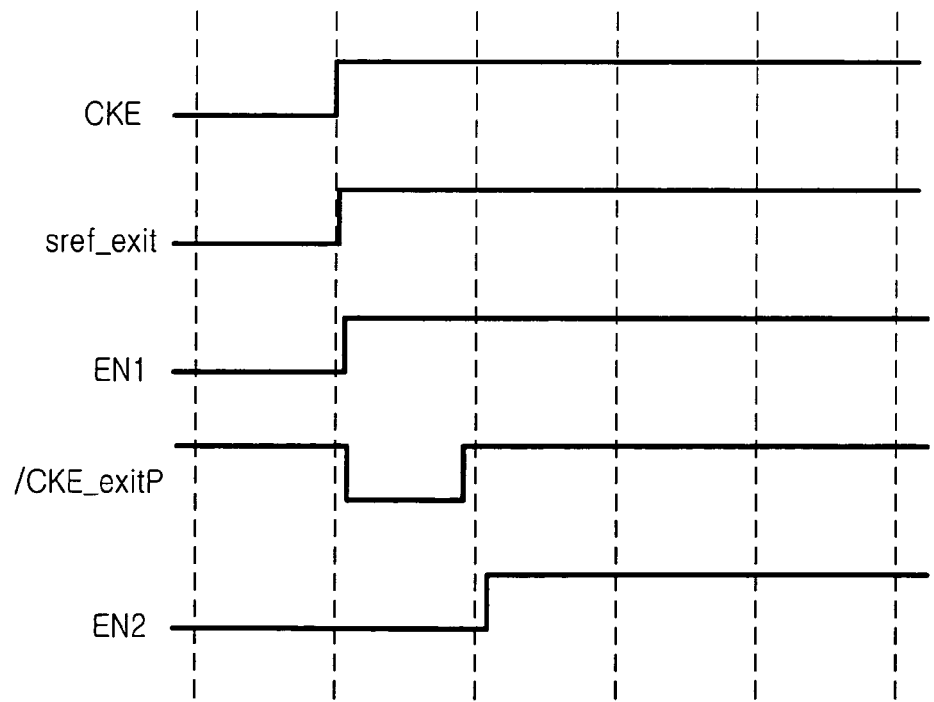
FIG. 5C is a timing diagram showing operations of a DLL power supplier and a DLL shown in FIG. 5A.

FIG. 5C is a timing diagram showing operations of the DLL power supplier 510 and the DLL 520.

If the clock enable signal CKE and a self refresh exit signal sref_exit are activated as a logic high level when the semiconductor memory device is exit from the power down mode or the self refresh mode, the first enable signal EN1 is activated as a logic high level and the clock enable exit pulse bar signal /CKE_exitP becomes in a logic low level. Then, the DLL power supplier 510 is enabled. Thereafter, if the clock enable exit pulse bar signal /CKE_exitP becomes in a logic high level, the second enable signal EN2 is activated as a logic high level. As a result, the DLL 520 is enabled in response to the second enable signal EN2.

Therefore, the DLL power supplier 510 can have an enough time to be set up while the clock enable exit pulse bar signal/CKE_exitP is in a logic low level so that the DLL power supplier 510 can stably supply the DLL power supply voltage VDLL to the DLL 520 when the DLL 520 is enabled.

As above described, a DLL power supplier in accordance with the present invention can stably supply a DLL power supply voltage to a DLL when a semiconductor memory device is exit from a power down mode or a self refresh mode. Therefore, a reliability of the semiconductor memory device can be improved.

The present application contains subject matter related to Korean patent application No. 2003-75931, filed in the Korean Patent Office on Oct. 29, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A delay locked loop (DLL) power supply circuit for use in a semiconductor memory device, comprising:
    a DLL power supplier for supplying a DLL power supply voltage to a DLL in response to a reference voltage and a clock enable exit pulse signal;
    a pulse signal generator for generating the clock enable exit pulse signal in response to a clock enable signal,
    wherein the DLL power supply voltage is supplied into a DLL as an operating voltage and the DLL power supplier outputs a power supply voltage as the DLL power supply voltage before the DLL is enabled when the semiconductor memory device exits from a power down mode or a self refresh mode.

2. The DLL power supply circuit as recited in claim 1, wherein the DLL power supplier raises a voltage level of the DLL power supply voltage if the voltage level of the DLL power supply voltage is lower than the reference voltage or lowers the voltage level of the DLL power supply voltage if the voltage level of the DLL power supply voltage is higher than the reference voltage.

3. The DLL power supply circuit as recited in claim 2, wherein the pulse signal generator includes:
    a delay unit which delays the clock enable signal for a predetermined delay time;
    a first NAND gate for receiving the clock enable signal and an output signal of the delay unit;
    a first inverter for inverting an output signal of the NAND gate in order to generate the clock enable exit pulse signal; and
    a second inverter for inverting the clock enable exit pulse signal in order to output a clock enable exit pulse bar signal.

4. The DLL power supply circuit as recited in claim 3, wherein the DLL power supplier includes:
    a comparator for comparing the reference voltage with the DLL power supply voltage and for outputting the comparison result;
    a PMOS driver unit connected to the power supply voltage for controlling the voltage level of the DLL power supply voltage based on the comparison result; and
    a PMOS driver unit controller for receiving the clock enable exit pulse signal in order to make the PMOS driver unit output the power supply voltage as the DLL power supply voltage.

5. The DLL power supply circuit as recited in claim 4, wherein the PMOS driver unit controller is an NMOS transistor whose gate, source and drain are respectively connected to the clock enable exit pulse signal, a ground voltage and the PMOS driver unit.

6. The DLL power supply circuit as recited in claim 5, wherein the NMOS transistor connects the ground voltage to the PMOS driver unit when the clock enable exit pulse signal is activated as a logic high level so that the PMOS driver unit can output the power supply voltage DLL power supply voltage.

7. The DLL power supply circuit as recited in claim 3, wherein the DLL power supplier includes:
    a comparator for comparing the reference voltage with the DLL power supply voltage and for outputting the comparison result;
    a PMOS driver unit connected to the power supply voltage for controlling the voltage level of the DLL power supply voltage based on the comparison result; and
    a PMOS driver unit controller for receiving the clock enable exit pulse bar signal and the reference voltage in order to make the PMOS driver unit output the power supply voltage as the DLL power supply voltage.

8. The DLL power supply circuit as recited in claim 7, wherein the PMOS driver unit controller includes:
    a second NAND gate for receiving the clock enable exit pulse bar signal and the reference voltage; and
    a third inverter for inverting an output signal of the NAND gate.

9. The DLL power supply circuit as recited in claim 8, wherein an output signal of the third inverter becomes in a logic low level when the clock enable exit pulse bar signal is activated as a logic low level so that the PMOS driver unit can output the power supply voltage DLL power supply voltage.

10. A semiconductor memory device capable of stably supplying a DLL power supply voltage, comprising:
    a DLL power supplier for supplying a DLL power supply voltage to a DLL in response to a reference voltage and a clock enable signal; and
    said DLL receives the DLL power supply voltage and an enable signal,
    wherein the DLL power supplier is enabled in response to the clock enable signal and the DLL is enabled after a predetermined delay time in response to the enable signal activated based on the clock enable signal and a clock enable exit pulse bar signal.

11. The semiconductor memory device as recited in claim 10, further comprising:

a pulse signal generator for generating the clock enable exit pulse bar signal in response to the clock enable signal; and an enable signal generator for generating the enable signal in response to the clock enable signal and a clock enable exit pulse bar signal.

12. The DLL power supply circuit as recited in claim 11, wherein the DLL power supplier raises a voltage level of the DLL power supply voltage if the voltage level of the DLL power supply voltage is lower than the reference voltage or lowers the voltage level of the DLL power supply voltage if the voltage level of the DLL power supply voltage is higher than the reference voltage.

13. The DLL power supply circuit as recited in claim 12, wherein the pulse signal generator includes:

a delay unit which delays the clock enable signal for the predetermined delay time;

a first NAND gate for receiving the clock enable signal and an output signal of the delay unit; and a plurality of inverters for inverting an output signal of the NAND gate in order to generate the clock enable exit pulse bar signal.

14. The DLL power supply circuit as recited in claim 13, wherein the enable signal generator includes:

a NAND gate for receiving the clock enable signal and the clock enable exit pulse bar signal; and an inverter for inverting an output signal of the NAND gate in order to output the enable signal.

* * * * *